(12) United States Patent
Nagahama et al.

(10) Patent No.: US 11,677,116 B2
(45) Date of Patent: Jun. 13, 2023

(54) BATTERY PACK

(71) Applicants: Makita Corporation, Anjo (JP); Murata Manufacturing Co., Ltd., Nagaokakyo (JP)

(72) Inventors: Tatsuya Nagahama, Anjo (JP); Hideyuki Taga, Anjo (JP); Toshiaki Ueno, Nagaokakyo (JP); Naoki Nishi, Nagaokakyo (JP)

(73) Assignees: MAKITA CORPORATION, Anjo (JP); MURATA MANUFACTURING CO., LTD., Nagaokakyo (JP)

( * ) Notice: Subject to any disclaimer, the term of this patent is extended or adjusted under 35 U.S.C. 154(b) by 530 days.

(21) Appl. No.: 16/824,232

(22) Filed: Mar. 19, 2020

(65) Prior Publication Data

US 2020/0321576 A1    Oct. 8, 2020

(30) Foreign Application Priority Data

Apr. 5, 2019    (JP) .............................. JP2019-072933

(51) Int. Cl.
*H01M 50/24* (2021.01)
*H01M 10/42* (2006.01)
(Continued)

(52) U.S. Cl.
CPC ....... *H01M 50/24* (2021.01); *H01M 10/4257* (2013.01); *H01M 50/213* (2021.01);
(Continued)

(58) Field of Classification Search
CPC .. H01M 50/24; H01M 10/4257; H01M 50/20; H01M 2010/4271; H01M 50/247;
(Continued)

(56) References Cited

U.S. PATENT DOCUMENTS

2005/0110458 A1    5/2005 Seman et al.
2005/0280393 A1   12/2005 Feldmann
(Continued)

FOREIGN PATENT DOCUMENTS

EP    3051608 A1    8/2016
EP    3660945 A1    6/2020
(Continued)

OTHER PUBLICATIONS

Jain, Arhant Prakash. "Elastomeric Engineering Materials Used in High Voltage Devices." IJMIE, vol. 3, iss. 8, Aug. 2013, pp. 646-656 (Year: 2013).*

(Continued)

*Primary Examiner* — Michael L Dignan
(74) *Attorney, Agent, or Firm* — J-Tek Law PLLC; Jeffrey D. Tekanic; Scott T. Wakeman

(57) ABSTRACT

A battery pack includes: a housing (18); one or more battery cells (12) housed inside the housing; one or more seat surfaces (52a, 54a, 56a, 58a) disposed inside the housing; a circuit board (16), which is housed inside the housing and is mounted on the seat surface(s); and one or more terminals (20b, 22b) electrically connected to the circuit board. One or more elastic sheets (60, 62) surround(s) the perimeter(s) of the terminal(s) and is (are) interposed between the circuit board and the seat surface(s).

18 Claims, 9 Drawing Sheets

(51) Int. Cl.
*H05K 1/18* (2006.01)
*H01M 50/291* (2021.01)
*H01M 50/247* (2021.01)
*H01M 50/284* (2021.01)
*H01M 50/213* (2021.01)

(52) U.S. Cl.
CPC ....... *H01M 50/247* (2021.01); *H01M 50/284* (2021.01); *H01M 50/291* (2021.01); *H05K 1/18* (2013.01); *H01M 2010/4271* (2013.01); *H05K 2201/09027* (2013.01); *H05K 2201/09172* (2013.01); *H05K 2201/10037* (2013.01)

(58) Field of Classification Search
CPC ............ H01M 50/284; H01M 50/291; H01M 50/213; H01M 10/425; H01M 50/107; H01M 2220/30; H01M 50/00; H05K 1/18; H05K 2201/09027; H05K 2201/09172; H05K 2201/10037; Y02E 60/10
See application file for complete search history.

(56) References Cited

U.S. PATENT DOCUMENTS

| | | | |
|---|---|---|---|
| 2010/0124693 A1* | 5/2010 | Kosugi | H01M 50/505 429/92 |
| 2012/0045665 A1 | 2/2012 | Park | |
| 2012/0045667 A1* | 2/2012 | Yoneda | H01M 50/213 429/7 |
| 2012/0082887 A1 | 4/2012 | Ninomiya et al. | |
| 2012/0141838 A1* | 6/2012 | Lin | H01M 10/34 429/7 |
| 2012/0231301 A1 | 9/2012 | Jang | |
| 2013/0224539 A1 | 8/2013 | Hayashi et al. | |
| 2013/0330576 A1* | 12/2013 | Kolden | H01M 50/60 429/7 |
| 2014/0017519 A1 | 1/2014 | Park | |
| 2014/0178715 A1 | 6/2014 | Koh | |
| 2014/0295257 A1 | 10/2014 | Harada | |
| 2014/0302353 A1* | 10/2014 | Ogura | H01M 50/296 429/7 |
| 2014/0349143 A1 | 11/2014 | Ogura et al. | |
| 2014/0356672 A1 | 12/2014 | Lee | |
| 2016/0226044 A1* | 8/2016 | Ikeda | H01M 50/3425 |
| 2017/0012272 A1* | 1/2017 | Naito | H01M 50/20 |
| 2017/0187010 A1* | 6/2017 | Hayashi | H01M 50/247 |
| 2017/0365826 A1* | 12/2017 | Varipatis | H01M 50/20 |
| 2020/0091548 A1* | 3/2020 | Zhang | H01R 13/11 |
| 2020/0176731 A1 | 6/2020 | Taga | |

FOREIGN PATENT DOCUMENTS

| | | |
|---|---|---|
| JP | S60179675 U | 11/1985 |
| JP | 2005114662 A | 4/2005 |
| JP | 2005317456 A | 11/2005 |
| JP | 2006100146 A | 4/2006 |
| JP | 2006100147 A | 4/2006 |
| JP | 2007508681 A | 4/2007 |
| JP | 2010123299 A | 6/2010 |
| JP | 2011171125 A | 9/2011 |
| JP | 2012043684 A | 2/2012 |
| JP | 2012043790 A | 3/2012 |
| JP | 2012190798 A | 10/2012 |
| JP | 2012253019 A | 12/2012 |
| JP | 2014123553 A | 7/2014 |
| JP | 2014154553 A | 8/2014 |
| JP | 2014203702 A | 10/2014 |
| JP | 2014203703 A | 10/2014 |
| JP | 2016143507 A | 8/2016 |
| WO | 2005039012 A2 | 4/2005 |
| WO | 2019021881 A1 | 1/2019 |

OTHER PUBLICATIONS

Extended European Search Report from the European Patent Office dated Aug. 20, 2020 in related EP application No. 20162501.9, including Search Opinion and Search Report.

Office Action from the Japanese Patent Office dated Dec. 6, 2022 in counterpart Japanese application No. 2019-072933, and machine translation thereof.

Search Report from the Japanese Patent Office dated Nov. 21, 2022 in counterpart Japanese application No. 2019-072933, and machine translation thereof.

Office Action from the Japanese Patent Office dispatched Feb. 7, 2023, in counterpart Japanese application No. 2019-072933, and machine translation thereof.

* cited by examiner

BATTERY PACK

CROSS-REFERENCE TO RELATED APPLICATION

This application claims priority to Japanese patent application no. 2019-072933 filed on Apr. 5, 2019, the contents of which are fully incorporated herein by reference.

TECHNICAL FIELD

The present teachings generally relate to a battery pack, e.g., for a power tool.

BACKGROUND ART

Japanese Laid-open Patent Publication 2011-171125 discloses a battery pack that comprises: a housing; battery cells, which are housed inside the housing; seat surfaces, which are disposed inside the housing; a circuit board, which is housed inside the housing and is mounted on the seat surfaces; and terminals within the housing, which are connected to the circuit board.

SUMMARY OF THE INVENTION

However, in the above-described known battery pack, there is a risk that an electrically conductive substance (liquid), such as water, will penetrate into the interior of the housing and adhere to surfaces of the circuit board. In this case, it is possible that one or more of the connection locations, at which the terminals are connected to the circuit board, will adversely short circuit with one or more other locations, thereby causing permanent damage to the battery cells and/or the circuit board.

It is therefore one non-limiting object of the present teachings to disclose a technique for preventing undesirable electrical short circuits between connection locations, at which the terminals are respectively electrically connected to the circuit board, and another electrically conductive terminal, material, etc., which should not be connected thereto.

In one aspect of the present teachings, a battery pack may comprise: a housing; one or more battery cells, which is (are) housed inside the housing; one or more seat surfaces, which is (are) disposed inside the housing; a circuit board, which is housed inside the housing and is mounted on the seat surface(s); one or more terminals within the housing, which is (are) connected to the circuit board; and one or more elastic sheets, which surround(s) the perimeter(s) of the terminal(s) and is (are) interposed between the circuit board and the seat surface(s).

Thus, even if an electrically conductive substance, such as water, has adhered to (contacts) a surface of the circuit board on the side that makes contact with the seat surfaces in the battery pack according to the above-described aspect, the connection locations—at which the circuit board and the terminals are respectively connected—are sealed by the elastic sheet(s). Therefore, it is possible to prevent adverse short circuiting between any of the connection locations at which the circuit board and the terminals are connected and another location. In addition, because the elastic sheet(s) is (are) interposed between the circuit board and the seat surface(s), the adhesion properties of the elastic sheet can be further improved.

Further objects, aspects, embodiments and advantages of the present teachings will become apparent to a person skilled in the art upon reading the following detailed description in conjunction with the appended claims and drawings.

DETAILED DESCRIPTION OF THE EMBODIMENTS

Figure 1:
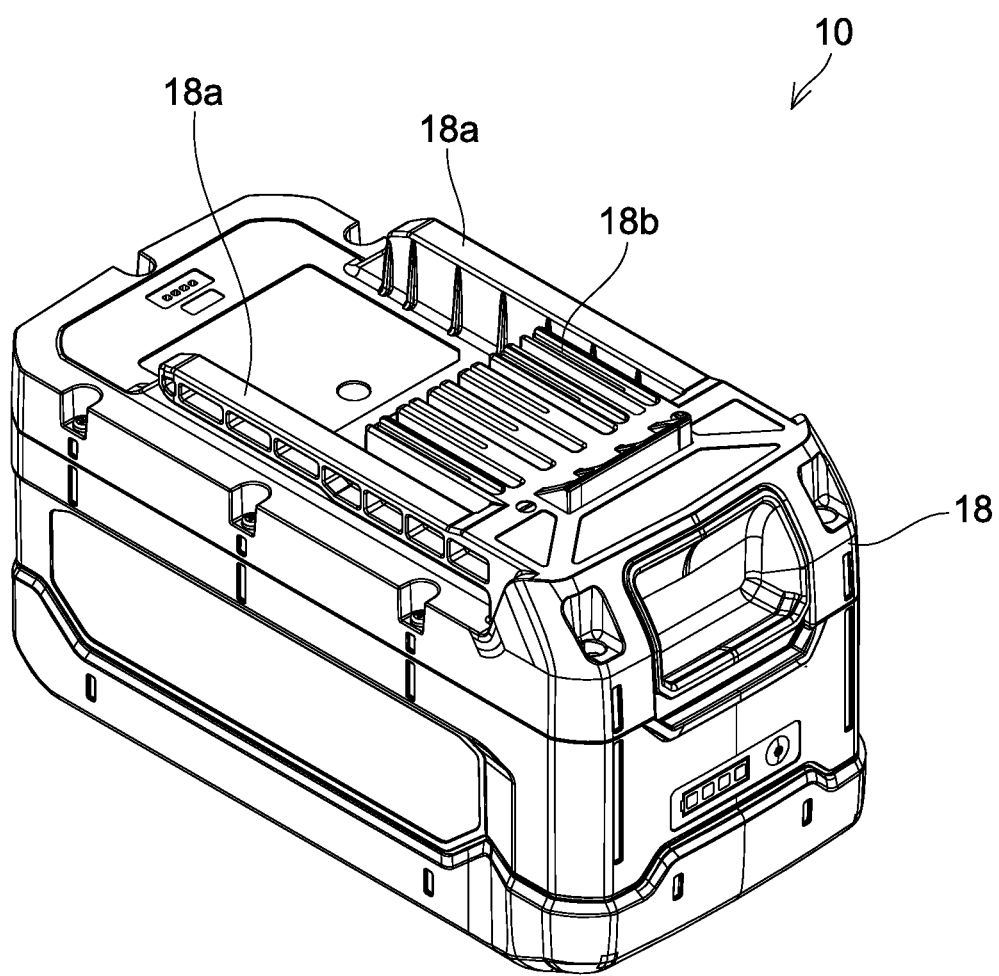
FIG. 1 is an oblique view that shows the external appearance of a battery pack 10 according to an exemplary embodiment of the present teachings.

Representative, non-limiting concrete examples of the present invention are described below in detail with reference to the drawings. This detailed description is merely intended to teach a person of skill in the art details for practicing preferred examples of the present invention and is not intended to limit the scope of the present invention. In addition, each of the additional features and inventions disclosed below may be used separately or in conjunction with other features and inventions to provide further improved battery packs, methods of manufacturing the same, and methods of using the same.

Moreover, combinations of features and steps disclosed in the below detailed description are not essential to practice the invention in the broadest sense, and are instead taught merely to particularly describe representative concrete examples of the present inventions. Furthermore, various features of the representative concrete examples described above and below, as well as the various features described in the independent and dependent claims, do not have to be combined as shown in the concrete examples described herein or in the illustrated order in order to provide additional useful embodiments of the present invention. In other words, such features may be combined in ways that are not specifically and explicitly enumerated in order to provide additional useful embodiments of the present teachings.

All features described in the present specification and/or the claims are intended to be disclosed separately and independently from each other for the purpose of original written disclosure, as well as for the purpose of restricting the claimed subject matter, independent of the compositions of the features described in the embodiments and/or the claims. In addition, all value ranges, or indications of groups and collections are intended to disclose every possible intermediate value or indication for the purpose of original written disclosure, as well as for the purpose of restricting the claimed subject matter.

In one or more embodiments of the present teachings, a battery pack may comprise: a housing; a battery cell or battery cells, which is (are) housed inside the housing; a seat surface or seat surfaces, which is (are) disposed inside the housing; a circuit board, which is housed inside the housing and is mounted on the seat surface(s); a terminal or terminals within the housing, which is (are) connected to the circuit board; and an elastic sheet or elastic sheets, which surround(s) (encircle(s)) the perimeter(s) of the terminal(s) and is interposed between the circuit board and the seat surface(s).

According to the above-mentioned configuration, even if an electrically conductive substance, such as water, has adhered to (contacts) a surface of the circuit board on the side that makes contact with the seat surface(s), the connection location(s)—at which the circuit board and the terminal(s) are connected (electrically connected)—is (are) sealed by the elastic sheet(s), and therefore it is possible to prevent adverse short circuiting between any of the connection location(s), at which the circuit board and the terminal(s) are respectively connected (electrically connected), and one or more other locations. In addition, according to the above-mentioned configuration, the elastic sheet(s) is (are) interposed between the circuit board and the seat surface(s), and therefore the adhesion properties of the elastic sheet can be further improved.

In one or more embodiments of the present teachings, the terminal(s) may be connected (electrically connected) to the battery cell(s).

In the event that any connection location, at which the circuit board and the terminal(s) and the battery cell(s) are connected (electrically connected), were to (hypothetically) adversely short circuit with another electrically-conductive location, a large electrical current may flow and cause permanent damage to the battery cell(s) and/or the circuit board. Therefore, a technique for reliably preventing short circuits is desirable. According to the above-mentioned configuration, it is possible to reliably prevent any connection location(s), at which the circuit board and the terminal(s) connected to the battery cell(s) are connected, from adversely short circuiting with another location owing to the fact that the elastic sheet(s) surround(s) the terminal or each of the terminals. In a preferred embodiment, one or more through holes are formed in the elastic sheet(s) and the terminal(s) (respectively) pass(es) through the hole(s).

In one or more embodiments of the present teachings, the battery pack may further comprise a cell holder, which is housed inside the housing and holds the battery cell(s). The seat surface(s) may be formed on the cell holder.

By using a configuration in which the seat surface(s) is (are) formed on the cell holder, which holds the battery cell(s), and the circuit board is mounted on those seat surface(s), the battery pack can be made more compact. According to the above-mentioned configuration of the battery pack, it is possible to prevent any connection location, at which the circuit board and the terminal(s) are connected (electrically connected), from adversely short circuiting with another location.

In one or more embodiments of the present teachings, the elastic sheet(s) may be bonded (glued, adhered) to the circuit board.

According to the above-mentioned configuration, by mounting the circuit board on the seat surface(s) with the elastic sheet(s) bonded to the circuit board, the elastic sheet(s) can be interposed between the circuit board and the seat surface(s) without dislodging during operation. In addition, the elastic sheet(s) may be easily aligned with the connection location(s), at which the circuit board and the terminal(s) are connected. For example, in an embodiment in which holes are formed in the elastic sheet(s) for passing through the terminals, the holes of the elastic sheet(s) are aligned with corresponding through holes formed in the circuit board.

In one or more embodiments of the present teachings, the terminals may comprise a first terminal, which is connected to the circuit board, and a second terminal, which is connected to the circuit board separately (spaced apart, discretely) from the first terminal. The shape(s) of the elastic sheet(s) is (are) preferably designed such that the elastic sheet(s) seamlessly and integrally surround(s) (encircle) the perimeters of both of the first terminal and the second terminal.

According to the above-mentioned configuration, the connection location at which the circuit board and the first terminal are connected and the connection location at which the circuit board and the second terminal are connected can be protected by the single elastic sheet. Accordingly, the part count of the battery pack can be reduced.

In one or more embodiments of the present teachings, the circuit board may have a notch between the connection location at which the first terminal and the circuit board are connected and the connection location at which the second terminal and the circuit board are connected. In embodiments in which three or more terminals are provided, one notch may be provided between each set of adjacent ones of the terminals, such that a plurality of notches may be provided in the circuit board, e.g., at regular intervals along one or both edges of the circuit board. The notch(es) is (are) preferably defined along an edge of the circuit board between adjacent connection locations such that a line intersecting the adjacent connection locations is intersected by the notch(es).

According to the above-mentioned configuration, it is possible to more reliably prevent the occurrence of adverse short circuiting between the connection location at which the circuit board and the first terminal are connected and the connection location at which the circuit board and the second terminal are connected.

In one or more embodiments of the present teachings, the battery pack may further comprise a (protective) coating or coatings, which is (are) provided on the surface of the circuit board on the side opposite the surface on which the elastic sheet(s) is (are) provided and cover(s) and/or seal(s) the connection location(s) at which the circuit board and the terminal(s) are connected.

In the above-mentioned configuration, on one surface of the circuit board, the connection location(s)—at which the circuit board and the terminal(s) is (are) connected—is (are) protected by the elastic sheet(s). On the other (opposite side) surface of the circuit board, the connection location(s)—at which the circuit board and the terminal(s) is (are) connected—is (are) protected by the coating(s). Accordingly, it is possible to more reliably prevent the occurrence of short circuiting between any connection locations, at which the circuit board and the terminal(s) are connected, and another location.

In one or more embodiments of the present teachings, the elastic sheet(s) may be composed of at least one material selected from the group consisting of rubber, elastomer, resin (polymer) foam, and sponge.

According to the above-mentioned configuration, the elastic sheet(s) can be prepared from a material that is easy to obtain and easy to mold, and consequently the manufacturing cost of the battery pack can be reduced.

Exemplary Embodiment

Figure 2:
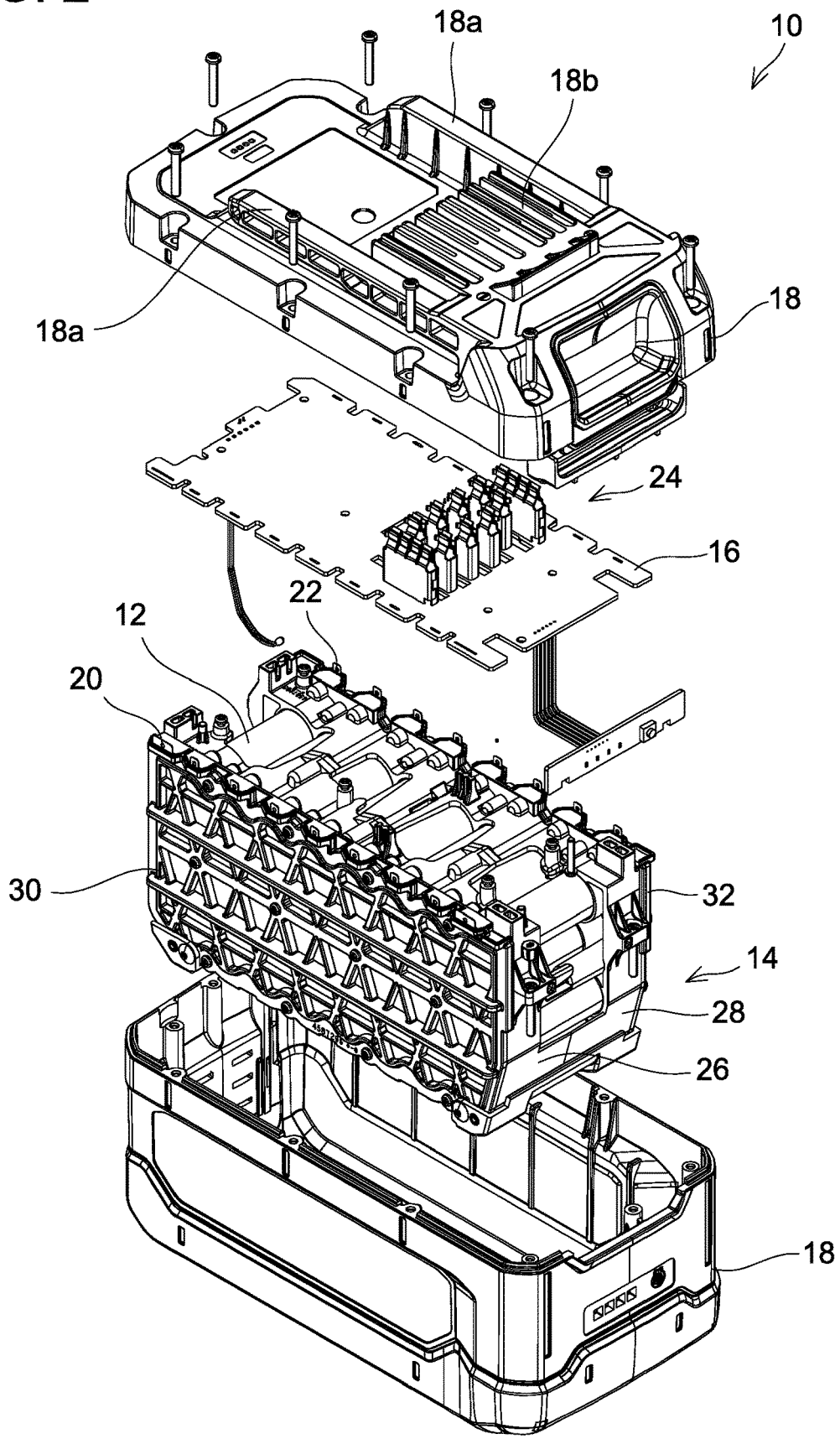
FIG. 2 is an exploded view of the battery pack 10 according to the exemplary embodiment.

A battery pack (battery cartridge) 10 according to one representative, non-limiting exemplary embodiment of the present teachings will now be explained, with reference to the drawings. The battery pack 10 of the present exemplary embodiment is a rechargeable power storage device that serves as a power supply for supplying electric power to an electrical device (not shown) such as a power tool, e.g., hammer driver-drills, circular saws, chain saws, lawn mowers, blowers, etc., and is mountable on and demountable (removable) from the electrical device. As shown in FIGS. 1 and 2, the battery pack 10 comprises: a plurality of battery cells 12; a cell holder (battery cell holder) 14, which holds the plurality of battery cells 12; and a circuit board 16, which is fixed to the cell holder 14 and is electrically connected to the plurality of battery cells 12. In addition, the battery pack 10 comprises a housing 18, which houses the plurality of battery cells 12, the cell holder 14, and the circuit board 16.

The battery cells 12 are held by the cell holder 14 such that the battery cells 12 are parallel to one another. Each of the battery cells 12 is a rechargeable battery cell. Although just one example of the present teachings, each of the battery cells 12 in the present exemplary embodiment may be, e.g., a lithium-ion battery cell having a nominal voltage of approximately 4 volts. In addition, with regard to the number of battery cells 12, thirty-two of the battery cells 12 may be arranged (electrically connected) such one set of battery cells consists of two battery cells 12 connected to one another in parallel and sixteen sets of such parallel-connected battery cells 12 are connected in series. In this arrangement, the battery pack 10 has a nominal voltage of approximately 64 volts.

The cell holder 14 is composed of an electrically-insulating material (e.g., a resin (synthetic) material, preferably a hard or rigid polymer material). A plurality of first lead plates (battery connection terminals) 20 and a plurality of second lead plates (battery connection terminals) 22 are incorporated in the cell holder 14. More specifically, the first lead plates 20 are disposed on one sidewall of the cell holder 14, and the second lead plates 22 are disposed on the other (opposite) sidewall of the cell holder 14. The battery cells 12 are electrically connected to one another by the first lead plates 20 and the second lead plates 22. In addition, each of the first lead plates 20 and each of the second lead plates 22 are electrically connected to the circuit board 16. The circuit board 16 has wiring or busbars that electrically connect(s) the first lead plates 20 and the second lead plates 22 in series, thereby creating the 64 volt power supply.

In the present specification, the term "lead plate" is used in a manner that is synonymous with "connection tabs" or "connection strips". It is noted that the term "lead" is being used in the sense of an "electrical lead" and not in the sense of the element lead (Pb). Thus, lead plates may be made of any conductive metal or alloy, such as copper, copper alloy, aluminum, aluminum alloy, etc.

Thus, the circuit board 16 is electrically connected to the plurality of battery cells 12 via the first lead plates 20 and the second lead plates 22. The circuit board 16 is configured/adapted to detect the voltages of each of the first lead plates 20 and the voltages of each of the second lead plates 22 and thereby can ascertain the voltage of each of the battery cells 12, in order to diagnose whether one or more of the battery cells 12 is undercharged and/or permanently damaged. In addition, a plurality of external-connection terminals 24 is provided on the circuit board 16. The external-connection terminals 24 are designed to be connected with the electrical device and may include, e.g., a pair of electric-power (plus and minus battery) terminals and one or more signal/data communication terminals. The pair of electric-power terminals is electrically connected to the battery cells 12 and outputs, to the electrical device, electrical power (current) discharged (supplied) from the battery cells 12. In addition, the pair of electric-power terminals is configured to be electrically connected to a charger (not shown) to receive charging current supplied from the charger for recharging the battery cells 12. The signal/data communication terminal(s) is (are) connected to a processor (not shown) provided on the circuit board 16. The processor (e.g., a microprocessor and memory) may execute programs for determining and outputting one or more signals indicative of, e.g., the current voltage of the battery pack 10, the remaining battery capacity of the battery pack 10, the temperature within the battery pack 10, etc.

The outer shape of the housing 18 is substantially rectangular parallelepiped. The housing 18 is preferably formed from a resin (synthetic) material, such as a hard or rigid polymer material. Engaging structures (e.g., rails) 18a for engaging with the electrical device and a plurality of openings 18b (e.g., slits), which receive corresponding connection terminals of the electrical device, are formed on an upper surface of the housing 18. The external-connection terminals 24 on the circuit board 16 are respectively disposed (extend) inside the plurality of openings 18b. It is noted that the configuration of the housing 18 explained herein is but one example, and the specific configuration of the housing 18 can be modified where appropriate.

Next, the structure of the cell holder 14 will be explained, with reference to FIG. 3. The cell holder 14 comprises a first holder main body 26 and a second holder main body 28. The first holder main body 26 and the second holder main body 28 are fixed to one another while sandwiching the plurality of battery cells 12 therebetween, thereby holding (retaining) the plurality of battery cells 12 such that the battery cells 12 are parallel to one another. The cell holder 14 further comprises a first holder cover 30 and a second holder cover 32. The first holder cover 30 sandwiches (covers) the plurality of first lead plates 20 and is mounted on (affixed to) the first holder main body 26, thereby fixing the plurality of first lead plates 20 to the first holder main body 26 (i.e., to the plurality of battery cells 12). The second holder cover 32 sandwiches (covers) the plurality of second lead plates 22 and is mounted on the second holder main body 28, thereby fixing the plurality of second lead plates 22 to the second holder main body 28 (i.e., to the plurality of battery cells 12).

A first outer-side waterproof sheet 34 is provided (interposed) between the first holder cover 30 and the plurality of first lead plates 20, and a first inner-side waterproof sheet 36 is provided (interposed) between the plurality of first lead plates 20 and the first holder main body 26. The first outer-side waterproof sheet 34 and the first inner-side waterproof sheet 36 are composed of silicone rubber and prohibit (block) the ingress of moisture, minute foreign matter, and the like. In other words, the first lead plates 20 are integrally held between a pair of waterproof films (34, 36) by virtue of being laminated therebetween. Similarly, a second outer-side waterproof sheet 38 is provided (interposed) between the second holder cover 32 and the plurality of second lead plates 22, and a second inner-side waterproof sheet 40 is provided (interposed) between the plurality of second lead plates 22 and the second holder main body 28. The second outer-side waterproof sheet 38 and the second inner-side waterproof sheet 40 are also composed of silicone rubber and prohibit the ingress of moisture, minute foreign matter, and the like. Thus, the second lead plates 22 are also integrally held between a pair of waterproof films (38, 40) by virtue of being laminated therebetween.

It is noted that each of the waterproof sheets 34, 36, 38, 40 is not limited to being composed of silicone rubber. That is, one, some or all of the waterproof sheets 34, 36, 38 and/or 40 may instead be composed of another type of flexible material having water-shielding properties, such as another high-molecular-weight (polymer) material, such as, for example: resin foams, such as polyethylene foam; elastomer and urethane-based sponge sheets; or the like. The waterproof sheets 34, 36, 38 and/or 40 preferably also function as electrical insulation sheets.

Figure 4:
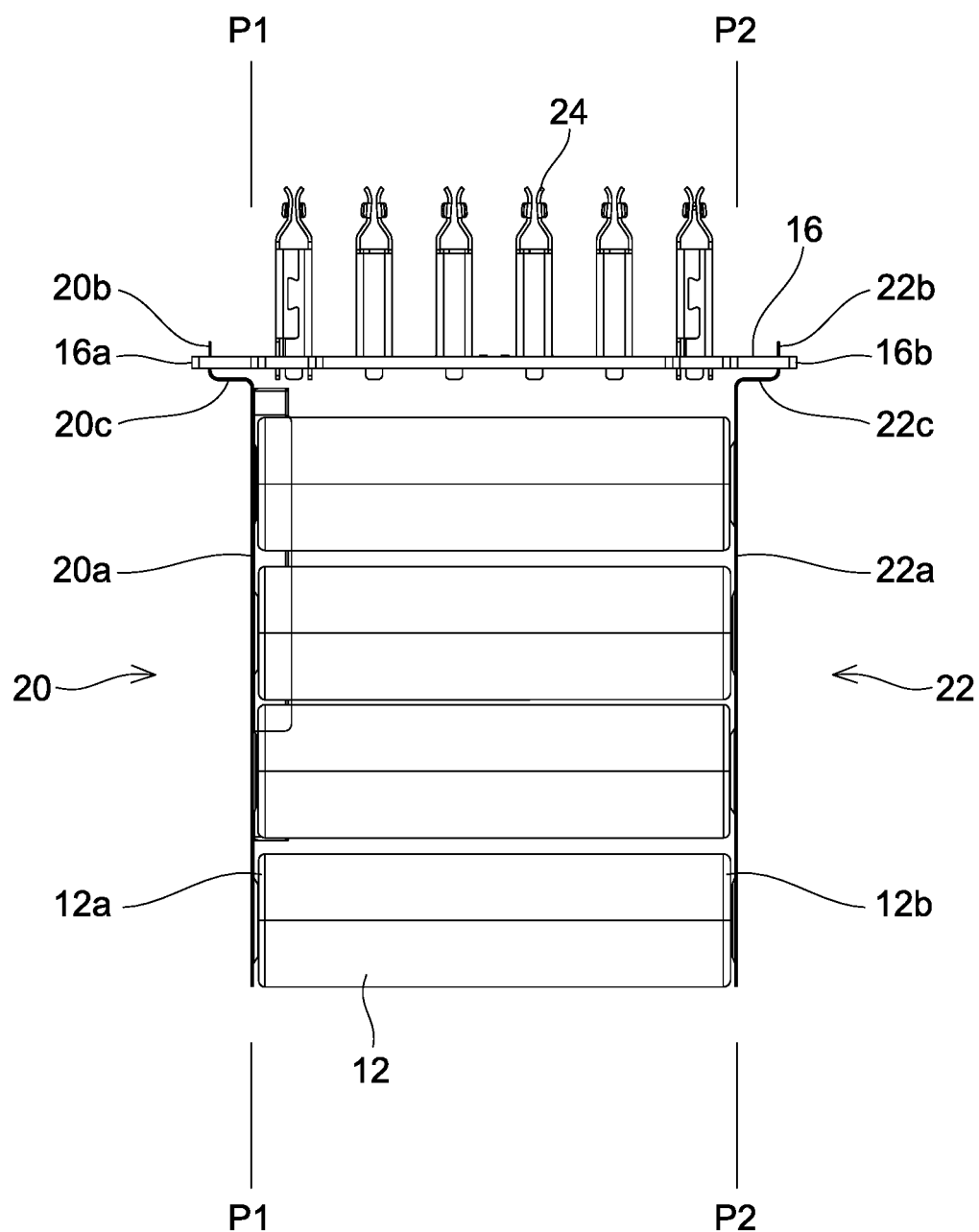
FIG. 4 is a front view of the positional relationships among a plurality of battery cells 12, a plurality of lead plates 20, 22, and a circuit board 16 in the exemplary embodiment.
Figure 5:
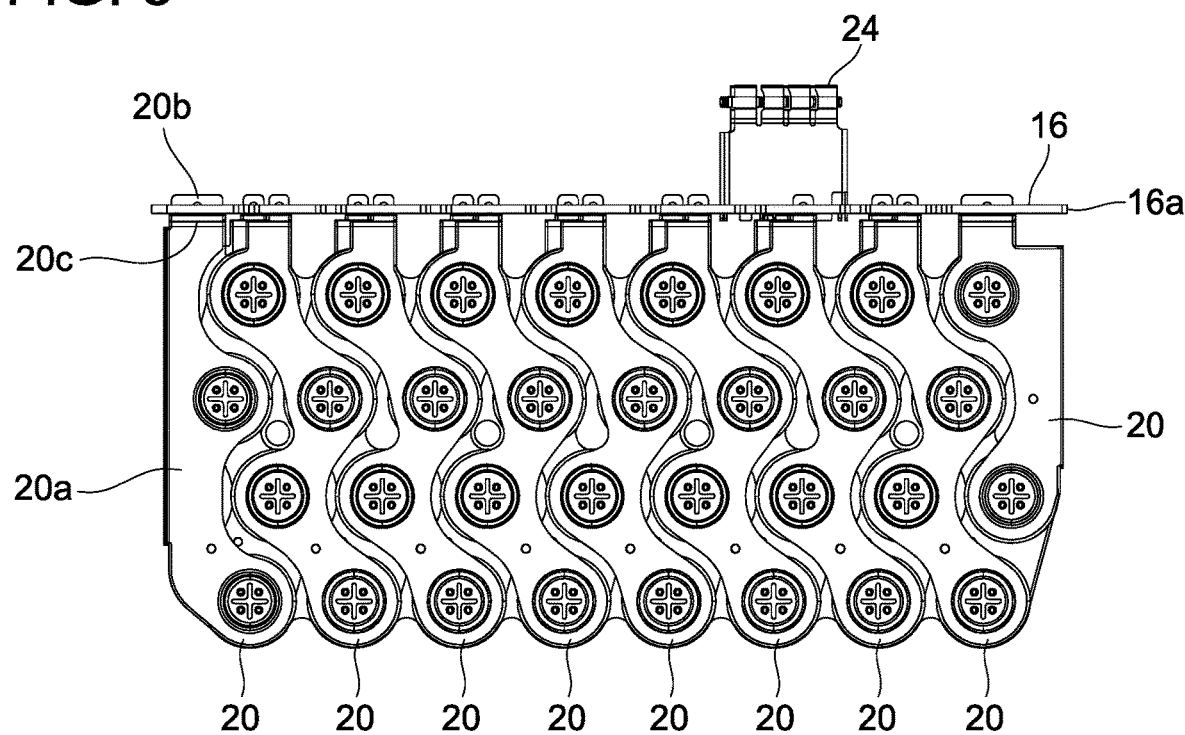
FIG. 5 is a left view of the positional relationships among the plurality of battery cells 12, the plurality of lead plates 20, 22, and the circuit board 16 in the exemplary embodiment.
Figure 6:
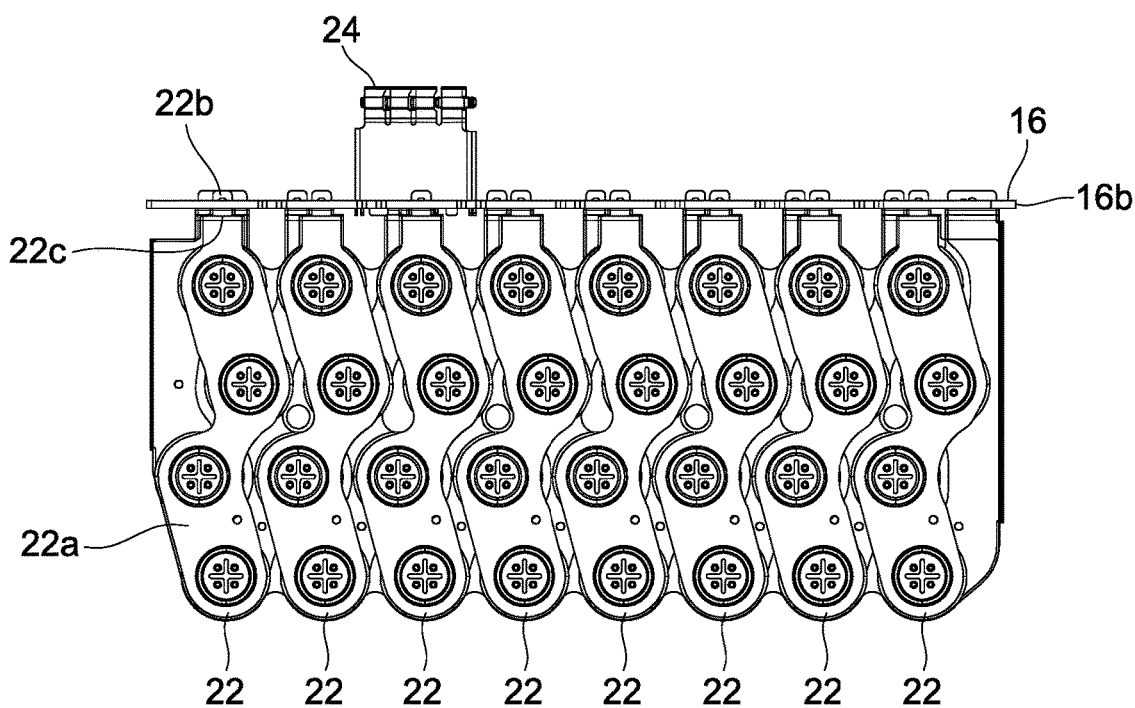
FIG. 6 is a right view of the positional relationships among the plurality of battery cells 12, the plurality of lead plates 20, 22, and the circuit board 16 in the exemplary embodiment.

Next, the structures of the first lead plates 20 and the second lead plates 22 will be explained further in detail. It is noted that the cell holder 14 is not shown in FIG. 4 to FIG. 6 for the sake of simplicity. As shown in FIG. 4 to FIG. 6, the first lead plates 20 are arrayed (arranged, disposed) along (within) a first plane P1, and the second lead plates 22 are arrayed (arranged, disposed) along (within) a second plane P2 that is preferably parallel or at least substantially parallel (e.g., less than an angle of 5°) with the first plane P1. Furthermore, each of the battery cells 12 comprises a first end 12a, which faces the first plane P1, and a second end 12b, which faces the second plane P2 parallel to the first plane P1. It is noted that the orientations of the battery cells 12 are not all the same. That is, some of the battery cells 12 have their positive electrodes on (at) the first ends 12a and their negative electrodes on (at) the second ends 12b, while the other battery cells 12 have their negative electrodes on (at) the first ends 12a and their positive electrodes on (at) the second ends 12b.

Each of the first lead plates 20 comprises: a first main portion (strip) 20a, which is located along (extends within) the first plane P1; a first terminal portion (tab) 20b, which passes through a hole (described below) in, and is electrically connected to, the circuit board 16 in the vicinity of a first side edge 16a of the circuit board 16; and a first extension (bent) portion 20c, which connects the first main portion 20a to the first terminal portion 20b. The first main portions 20a are respectively connected to one or more of the first ends 12a (i.e., the positive electrode or the negative electrode) of the battery cells 12. Although not particularly limited, in the present exemplary embodiment, the first main portions 20a are joined (electrically connected) to the first end(s) 12a of one or more of the battery cells 12 by spot welding (electrical resistance welding). A plurality of first through holes 16c (see FIGS. 7, 9, and 10) is formed, corresponding to the plurality of first terminal portions 20b, in the circuit board 16. Thus, the first terminal portions 20b respectively pass through, from a rear-surface side to a front-surface side, the circuit board 16 via the corresponding first through holes 16c and are joined (electrically connected) to the circuit board 16 by soldering.

Likewise, each of the second lead plates 22 comprises: a second main portion (strip) 22a, which is located along (extends within) the second plane P2; a second terminal portion (tab) 22b, which passes through a hole (described below) in, and is electrically connected to, the circuit board 16 in the vicinity of a second side edge 16b of the circuit board 16; and a second extension (bent) portion 22c, which connects the second main portion 22a to the second terminal portion 22b. The second main portions 22a are respectively connected to one or more of the second ends 12b (i.e., the positive electrode or the negative electrode) of the battery cells 12. Although not particularly limited, in the present exemplary embodiment, the second main portions 22a are joined (electrically connected) to the second end(s) 12b of one or more of the battery cells 12 by spot welding (resistance welding). A plurality of second through holes 16d see FIGS. 7, 9, and 10) is formed, corresponding to the plurality of second terminal portions 22b, in the circuit board 16. Thus, the second terminal portions 22b respectively pass through, from the rear-surface side to the front-surface side, the circuit board 16 via the corresponding second through holes 16d and are joined (electrically connected) to the circuit board 16 by soldering.

Figure 7:
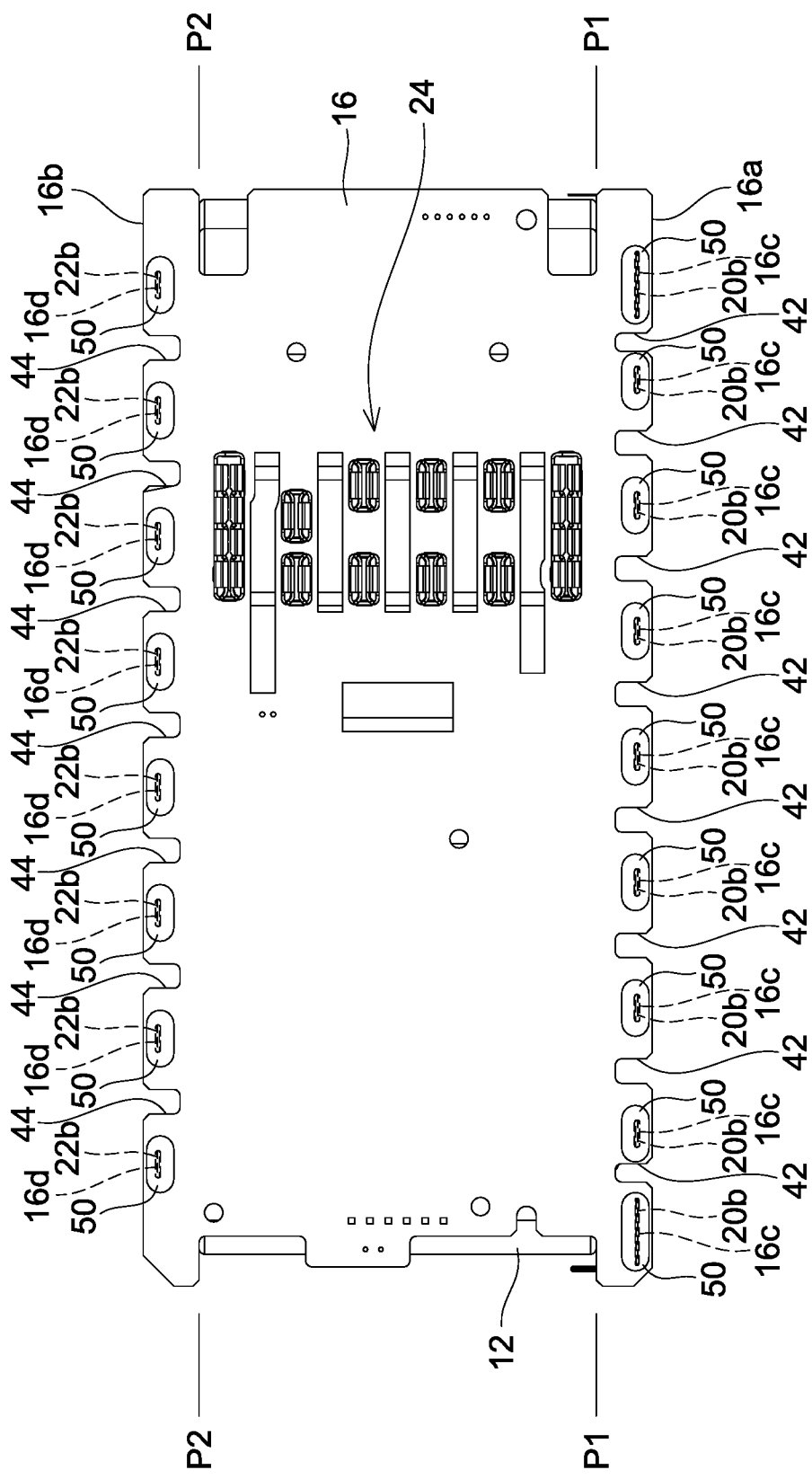
FIG. 7 is a plan view of the positional relationships among the plurality of battery cells 12, the plurality of lead plates 20, 22, and the circuit board 16 in the exemplary embodiment.

As shown in FIG. 7, the front-surface side of the circuit board 16 is coated with coatings 50 that respectively cover the connection locations at which the first terminal portions 20b are connected to the circuit board 16 and the connection locations at which the second terminal portions 22b are connected to the circuit board 16. The coatings 50 are composed of, for example, urethane resin (polyurethane), epoxy resin, polyurea, or the like. Therefore, even if an electrically conductive substance, such as water, has adhered to (contacts) the front-surface side of the circuit board 16, the coatings 50 can prevent the first terminal portions 20b and the second terminal portions 22b from adversely short circuiting with their adjacent first terminal portions 20b and second terminal portions 22b, respectively. Therefore, the coatings 50 are preferably a durable, tough, electrically-insulating material that encapsulates the first and second terminal portions 20b, 22b. The coatings 50 are also preferably hard. In the present embodiment, a plurality of discrete (non-continuous) coatings 50 is provided, but it is also possible to apply the coating material such that two or more of the connection locations (first and/or second terminal portions 20b, 22b) are covered (encapsulated) by a common (seamless) coating 50.

As shown in FIGS. 4 and 7, the circuit board 16 extends from the first side edge 16a to the second side edge 16b, which is located on the side opposite the first side edge 16a, such that the circuit board 16 intersects (and is preferably perpendicular to) the first plane P1 and the second plane P2. That is, the circuit board 16 according to the present exemplary embodiment is comparatively large, and its width from the first side edge 16a to the second side edge 16b is greater than the length of the battery cells 12.

As shown in FIG. 7, in the battery pack 10 according to the present exemplary embodiment, a plurality of first notches 42 is provided on (in) the first side edge 16a of the circuit board 16. Each of the first notches 42 extends (is disposed) between two adjacent first terminal portions 20b in the direction of the first plane P1. Owing to such a configuration (arrangement) of the notches 42 and the locations of the first terminal portions 20b, the electrical insulation properties between the first terminal portions 20b on the circuit board 16 can be improved, because there is no bridge-like material between adjacent first terminal portions 20b in the direction of the first plane P1. In a similar manner, a plurality of second notches 44 also is provided on the second side edge 16b of the circuit board 16. Each of the second notches 44 extends (is disposed) between two adjacent second terminal portions 22b in the direction of the second plane P2. Again, owing to such a configuration (arrangement) of the notches 44 and the locations of the second terminal portions 22b, the electrical insulation properties between the second terminal portions 22b on the circuit board 16 can be improved, because there is no bridge-like material between adjacent second terminal portions 22b in the direction of the second plane P2.

Figure 3:
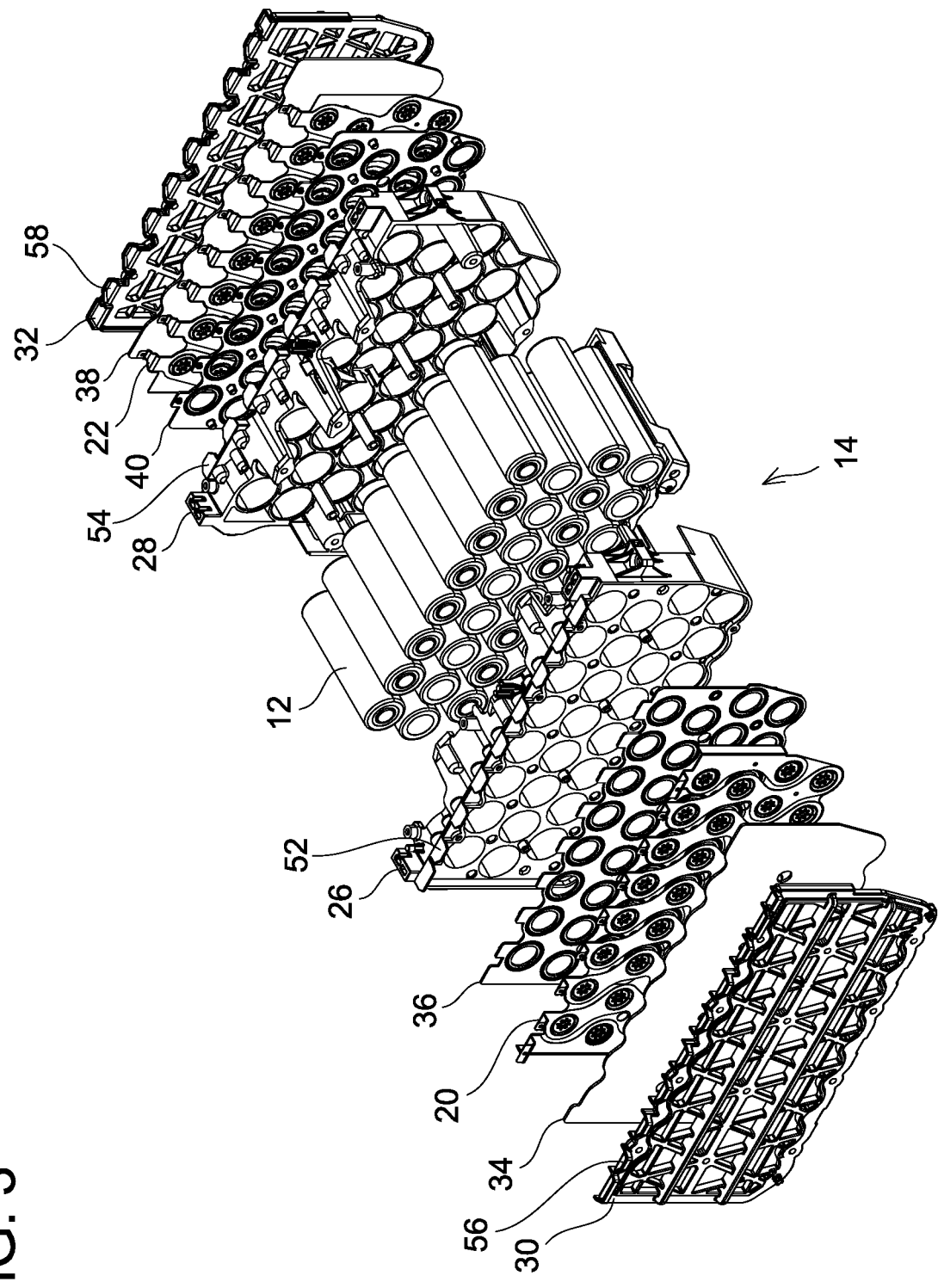
FIG. 3 is an exploded view of a cell holder 14 according to the exemplary embodiment.
Figure 8:
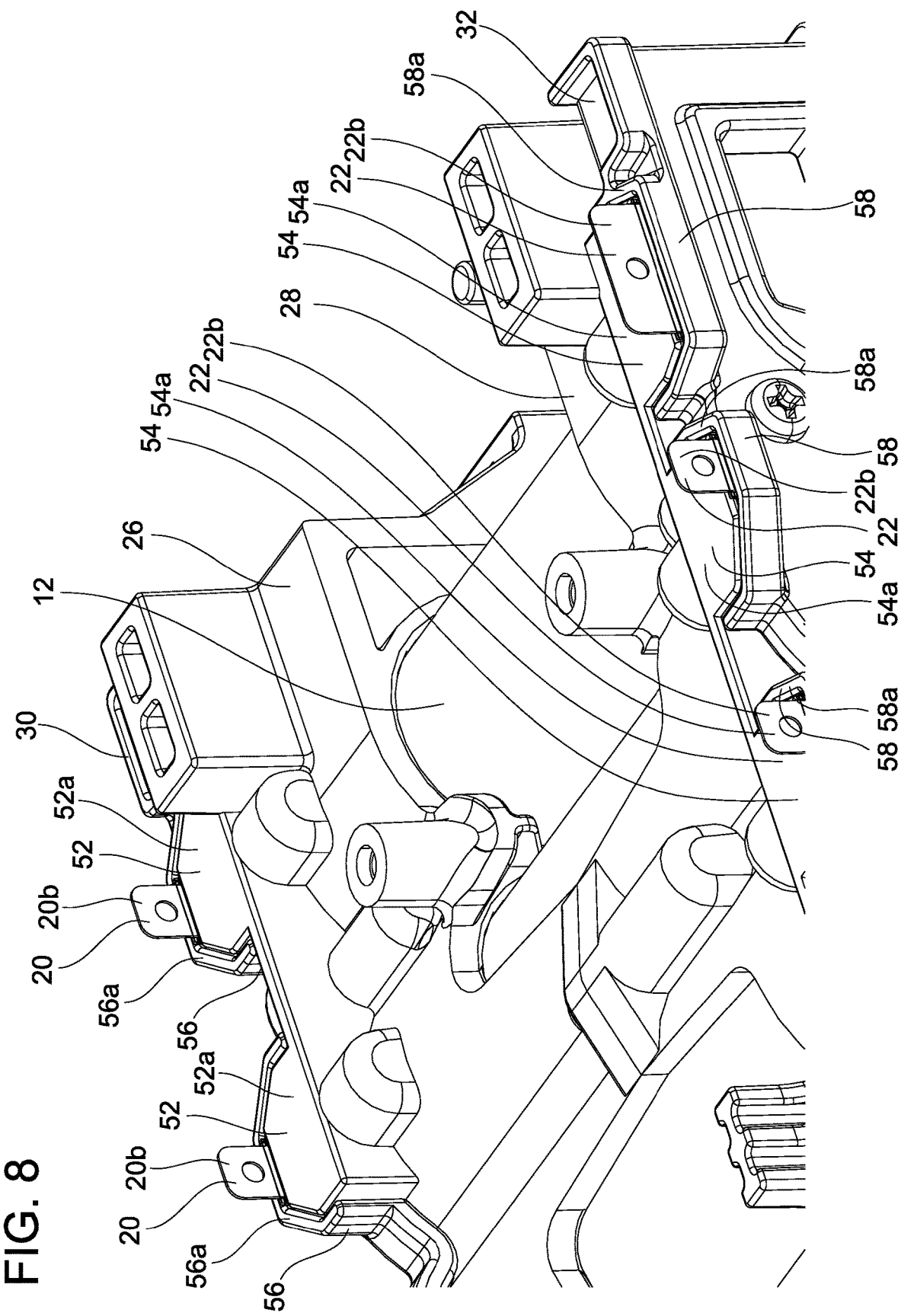
FIG. 8 is a partial, external, oblique view of the cell holder 14 according to the exemplary embodiment.
Figure 10:
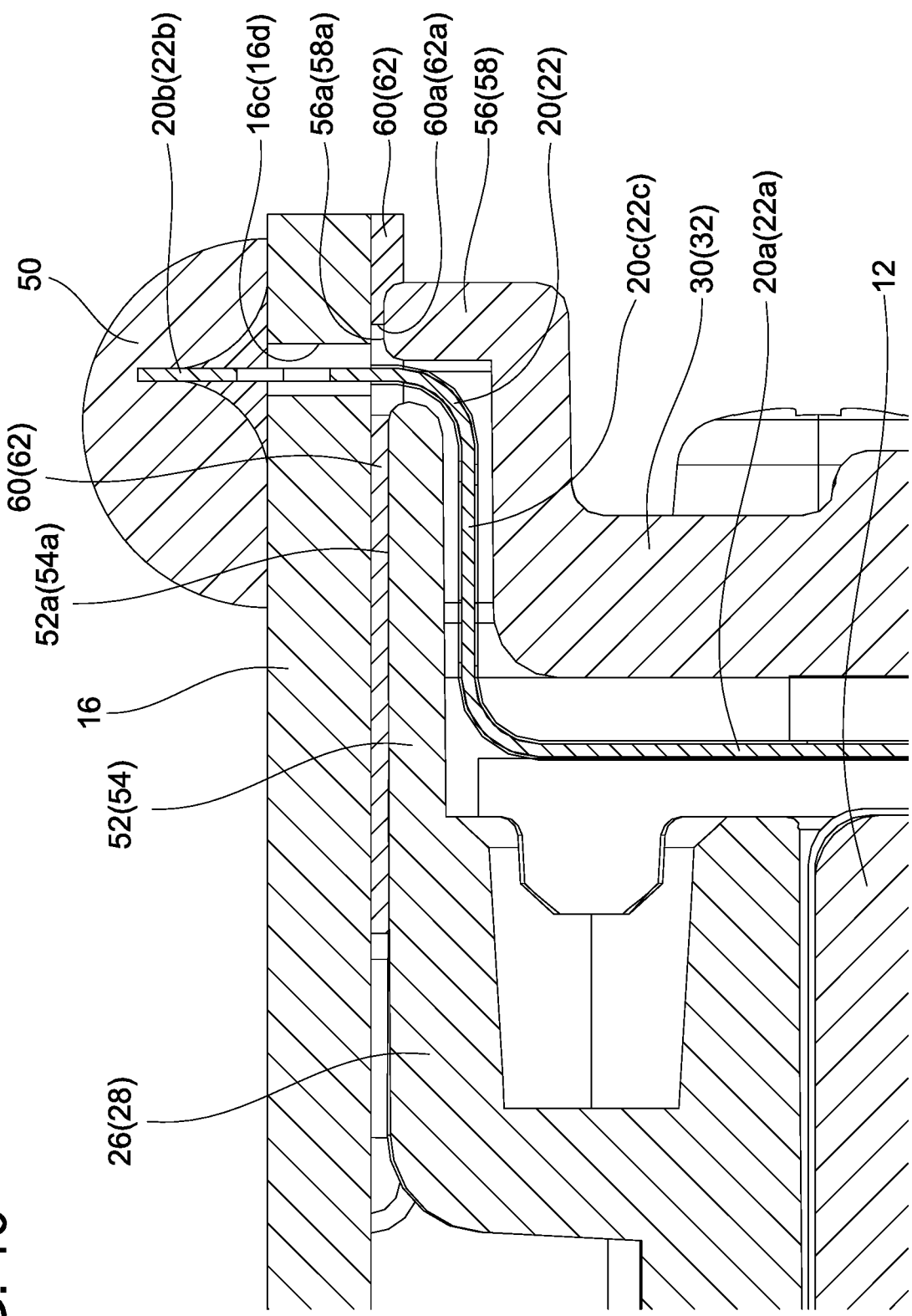
FIG. 10 is a cross-sectional view that shows an exemplary structure of a connection location, at which a first terminal portion 20*b* (second terminal portion 22*b*) is connected to the circuit board 16, in the exemplary embodiment.

As shown in FIGS. 3 and 8, in the battery pack 10 according to the present exemplary embodiment, a plurality of first support pieces (flanges, cantilevers) 52 is formed (arrayed, arranged), corresponding to the plurality of first lead plates 20, on (along an edge of) the first holder main body 26. As shown in FIG. 10, when the circuit board 16 has been mounted on the cell holder 14, each of the first support pieces 52 is interposed between the circuit board 16 and the first extension (bent) portion 20c of the corresponding first lead plate 20. Likewise, a plurality of second support pieces (flanges, cantilevers) 54 is formed (arrayed, arranged), corresponding to the plurality of second lead plates 22, on (along an edge of) the second holder main body 28. When the circuit board 16 has been mounted on the cell holder 14, each of the second support pieces 54 is interposed between the circuit board 16 and the second extension (bent) portion 22c of the corresponding second lead plate 22.

As also shown in FIGS. 3 and 8, in the battery pack 10 according to the present exemplary embodiment, a plurality of first support platforms (bent flanges) 56 is formed, corresponding to the plurality of first support pieces 52, on the first holder cover 30. Each of the first support platforms 56 is formed into (has) a shape that surrounds the perimeter of the corresponding first support piece 52 and the perimeter of the first extension portion 20c of the corresponding first lead plate 20. Likewise, a plurality of second support platforms (bent flanges) 58 is formed, corresponding to the plurality of second support pieces 54, on the second holder cover 32. Each of the second support platforms 58 is formed into (has) a shape that surrounds the perimeter of the corresponding second support piece 54 and the perimeter of the second extension portion 22c of the corresponding second lead plate 22.

Each of the first support pieces 52 has a first inner-side seat surface 52a, which opposes the rear surface of the circuit board 16. Each of the second support pieces 54 has a second inner-side seat surface 54a, which opposes the rear surface of the circuit board 16. Each of the first support platforms 56 has a first outer-side seat surface 56a, which opposes the rear surface of the circuit board 16. Each of the second support platforms 58 has a second outer-side seat surface 58a, which opposes the rear surface of the circuit board 16. When the circuit board 16 is to be mounted on the cell holder 14, the circuit board 16 is fixed by one or more screws (not shown) to the cell holder 14 with the circuit board 16 mounted on the first inner-side seat surfaces 52a, the second inner-side seat surfaces 54a, the first outer-side seat surfaces 56a, and the second outer-side seat surfaces 58a.

Figure 9:
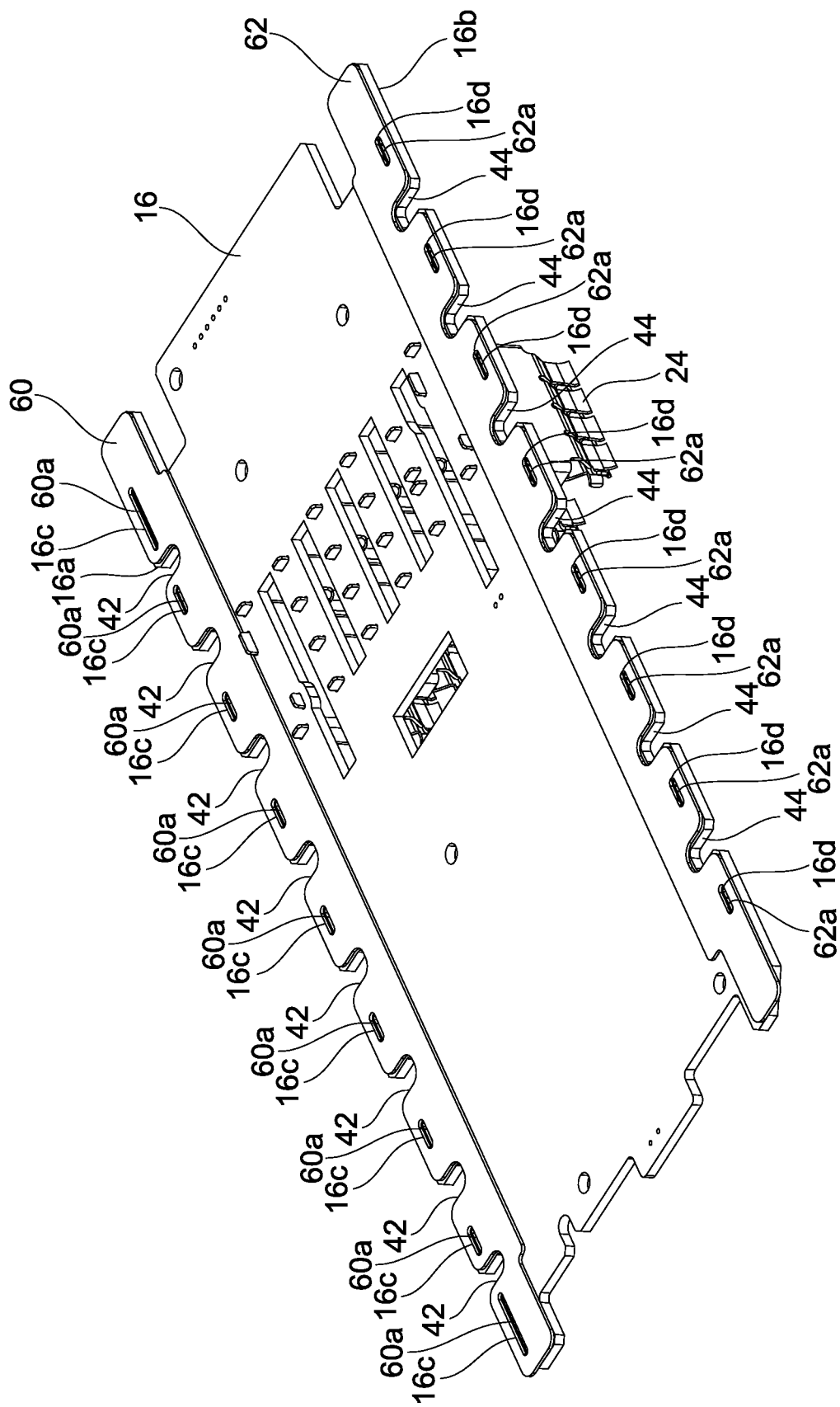
FIG. 9 is an oblique view that shows the external appearance of a rear-surface side of the circuit board 16 according to the exemplary embodiment.

As shown in FIG. 9, a first waterproof sheet (gasket) 60 and a second waterproof sheet (gasket) 62 are bonded (glued, adhered) to the rear surface of the circuit board 16. The first waterproof sheet 60 may extend in parallel or substantially in parallel to second waterproof sheet 62. Furthermore, the first plane P1 intersects the first waterproof sheet 60 and the second plane P2 intersects the second waterproof sheet 62. The first waterproof sheet 60 and the second waterproof sheet 62 are composed of silicone rubber and prohibit (block) the ingress of moisture, minute foreign matter, and the like to the first and second terminal portions 20b, 22b between the circuit board 16 on the one side and the cell holder 14 on the other side.

The first waterproof sheet 60 is a single (seamless, integral) sheet material that is bonded from one end part to the other end part of the circuit board 16 in the longitudinal direction along the first side edge 16a. The first waterproof sheet 60 is formed into (has) a shape such that the perimeter of each of the first through holes 16c of the circuit board 16 is surrounded (encircled) in the direction perpendicular to the extension direction of the first terminal portions 20b that respectively pass through the first through holes 16c of the circuit board 16. More specifically, a set of first through holes 60a is defined in the first waterproof sheet 60 and these first through holes 60a are respectively aligned with the first through holes 16c of the circuit board 16 in the extension direction of the first terminal portions 20b. Consequently, when the circuit board 16 has been mounted on the cell holder 14, the first waterproof sheet 60 is disposed such that the material of the first waterproof sheet 60 surrounds (encircles) the perimeters of all of the first terminal portions 20b of the plurality of first lead plates 20. Therefore, even if an electrically conductive substance, such as water, has adhered to (contacts) the rear-surface side of the circuit board 16, the first waterproof sheet 60 blocks the ingress of such electrically conductive substance into the space around the perimeters of the first terminal portions 20b, thereby preventing the first terminal portions 20b from adversely short circuiting with each other (i.e. with adjacent first terminal portions 20b).

Likewise, the second waterproof sheet 62 is a single (seamless, integral) sheet material that is bonded from one end part to the other end part of the circuit board 16 in the longitudinal direction along the second side edge 16b. The second waterproof sheet 62 is formed into (has) a shape such that that the perimeter of each of the second through holes 16d of the circuit board 16 is surrounded (encircled) in the direction perpendicular to the extension direction of the second terminal portions 22b that respectively pass through the second through holes 16d of the circuit board 16. More specifically, a set of second through holes 62a is defined in the second waterproof sheet 62 and these second through holes 62a are respectively aligned with the second through holes 16d of the circuit board 16 in the extension direction of the second terminal portions 22b. Consequently, when the circuit board 16 has been mounted on the cell holder 14, the second waterproof sheet 62 is disposed such that the material of the second waterproof sheet 62 surrounds (encircles) the perimeters of all of the second terminal portions 22b of the plurality of second lead plates 22. Consequently, even if an electrically conductive substance, such as water, has adhered to (contacts) the rear-surface side of the circuit board 16, the second waterproof sheet 62 blocks the ingress of such electrically conductive substance into the space around the perimeters of the second terminal portions 22b, thereby preventing the second terminal portions 22b from adversely short circuiting with each other (i.e. with adjacent second terminal portions 22b).

It is noted that the first waterproof sheet 60 and the second waterproof sheet 62 are not limited to being composed of silicone rubber. That is, one or both of the first and waterproof sheets 60, 62 may instead be composed of another type of flexible (preferably, compressible) material having other water-shielding properties, such as another high-molecularweight (polymer) material, such as, for example: a resin foam, such as polyethylene foam; an elastomer or urethane-based sponge sheet; and the like. The first and second waterproof sheets 60, 62 preferably function as electrical insulation sheets, as well as vibration absorbing materials, thereby reducing chattering between the cell holder 14 and the circuit board 16 during operation.

The waterproof sheets 34, 36, 38, 40 and the first and second waterproof sheets 60, 62 optionally may be composed of the same material, but the present teachings are not limited thereto. The first and second waterproof sheets 60, 62 (and optionally the waterproof sheets 34, 36, 38, 40 as well) are preferably resiliently compressible (elastic) in their thickness direction. In accordance with ASTM F36, the material of the first and second waterproof sheets 60, 62 (and optionally the waterproof sheets 34, 36, 38, 40 as well) preferably exhibits a compressibility of at least 3%, preferably at least 10%, preferably at least 20%, preferably at least 30%, preferably 40%, when placed under a load of 5,000 psi (34.5 MPa) for 60 seconds. Furthermore, in accordance with ASTM F36, the material of the first and second waterproof sheets 60, 62 (and optionally the waterproof sheets 34, 36, 38, 40 as well) preferably exhibits a recovery of at least 40%, preferably at least 50%, preferably at least 60%, preferably 70%, after the load is taken off and the material is given 60 seconds to spring back.

The material of the first and second waterproof sheets 60, 62 (and optionally the waterproof sheets 34, 36, 38, 40 as well) preferably exhibits a compression set of equal to or less than 50%, preferably equal to or less than 40%, preferably equal to or less than 30%, preferably equal to or less than 20%.

The thickness of the first and second waterproof sheets 60, 62 (and optionally the waterproof sheets 34, 36, 38, 40 as well) is preferably greater than or equal to 0.3 mm, preferably greater than or equal to 0.5 mm, preferably greater than or equal to 1 mm, preferably greater than or equal to 1.5 mm, preferably greater than or equal to 2 mm. The thickness of the first and second waterproof sheets 60, 62 (and optionally the waterproof sheets 34, 36, 38, 40 as well) is preferably less than or equal to 4 mm, preferably less than or equal to 3.5 mm, preferably less than or equal to 3 mm, preferably less than or equal to 2.5 mm. The thickness of the first and second waterproof sheets 60, 62 (and optionally the waterproof sheets 34, 36, 38, 40 as well) may fall within a range defined by any of the preceding upper and lower limits.

As shown in FIG. 10, in the battery pack 10 according to the present exemplary embodiment, when the circuit board 16 has been mounted on the cell holder 14, the first waterproof sheet 60 is interposed between and pressed (compressed) by the first inner-side seat surfaces 52a and the rear surface of the circuit board 16 and is also interposed between and pressed (compressed) by the first outer-side seat surfaces 56a and the rear surface of the circuit board 16. Thereby, owing to the first waterproof sheet 60, the waterproofness of the first lead plates 20 (in particular, the first terminal portions 20b thereof) can be further increased and improved electrical isolation (insulation) between the first terminal portions 20b on the circuit board 16 can be provided. Likewise, when the circuit board 16 has been mounted on the cell holder 14, the second waterproof sheet 62 is interposed between and pressed (compressed) by the second inner-side seat surfaces 54a and the rear surface of the circuit board 16 and is also interposed between and pressed (compressed) by the second outer-side seat surfaces 58a and the rear surface of the circuit board 16. Thereby, owing to the second waterproof sheet 62, the waterproofness of the second lead plates 22 (in particular, the second terminal portions 22b thereof) can be further increased and improved electrical isolation (insulation) between the second terminal portions 22b on the circuit board 16 can be provided.

It is noted that, although a configuration was explained in the above-described exemplary embodiment that prevents any of the connection locations at which the circuit board 16 on one side and the first lead plates 20 and the second lead plates 22, which are connected to the battery cells 12, on the other side are connected from short circuiting with another location, the same configuration may be applied between connection locations at which the circuit board 16 and other terminals are connected and may be applied between connection locations at which another circuit board and other terminals are connected.

In the above-described exemplary embodiment, when the circuit board 16 is viewed from the front-surface side (or the rear-surface side) in plan view, the first side edge 16a and the second side edge 16b each extend substantially rectilinearly. Furthermore, the plurality of first through holes 16c and the plurality of second through holes 16d are disposed rectilinearly along the first side edge 16a and the second side edge 16b, respectively. Consequently, the connection locations—at which the circuit board 16 and the plurality of first terminal portions 20b are respectively connected—are disposed rectilinearly along the first side edge 16a, and the first waterproof sheet 60 has a substantially oblong (elongated) shape with through holes 60a corresponding to the connection locations at which the circuit board 16 and the plurality of first terminal portions 20b are respectively connected. Likewise, the connection locations—at which the circuit board 16 and the plurality of first terminal portions 20b are respectively connected—are disposed rectilinearly along the second side edge 16b, and the second waterproof sheet 62 has a substantially oblong (elongated) shape with through holes 62a corresponding to the connection locations at which the circuit board 16 and the plurality of second terminal portions 22b are connected.

However, when the circuit board 16 is viewed from the front-surface side (or the rear-surface side) in plan view, in alternate embodiments of the present teachings, the first side edge 16a and the second side edge 16b do not have to be rectilinear, and the plurality of first through holes 16c and the plurality of second through holes 16d do not have to be disposed rectilinearly. In addition, the first waterproof sheet 60 may be formed into (may have) any shape as long as the material of the first waterproof sheet 60 surrounds (encircles) the perimeter of every connection location at which the circuit board 16 and the plurality of first terminal portions 20b are respectively connected. Similarly, the second waterproof sheet 62 may be formed into (may have) any shape as long as the material of the second waterproof sheet 62 surrounds (encircles) the perimeter of every connection location at which the circuit board 16 and the plurality of second terminal portions 22b are respectively connected.

For example, if one or more screw-fastening parts (not shown), which is (are) for fixing the circuit board 16 to the cell holder 14 using one or more screws, is (are) provided in the vicinity of the connection locations at which the circuit board 16 and the plurality of first terminal portions 20b are respectively connected, in the vicinity of the connection locations at which the circuit board 16 and the plurality of second terminal portions 22b are respectively connected, or the like, then the first waterproof sheet 60, the second waterproof sheet 62, or the like may be formed into (may have) a shape that circumvents (goes around) the vicinity of the screw-fastening part(s). In addition or in the alternative, if a drain hole (not shown) is formed in the circuit board 16 in the vicinity of the connection locations at which the circuit board 16 and the plurality of first terminal portions 20*b* are respectively connected, in the vicinity of the connection locations at which the circuit board 16 and the plurality of second terminal portions 22*b* are respectively connected, or the like, then the first waterproof sheet 60, the second waterproof sheet 62, or the like may be formed into a shape that circumvents (goes around) the vicinity of the drain hole.

As described above, in one or more embodiments of the present teachings, the battery pack 10 may optionally comprise: the housing 18; the battery cells 12, which are housed inside the housing 18; the first inner-side seat surfaces 52*a* and the first outer-side seat surfaces 56*a* (and optionally the second inner-side seat surfaces 54*a* and the second outer-side seat surfaces 58*a*) (representative, non-limiting examples of a "seat surface" according to the present teachings) disposed inside the housing 18; the circuit board 16 (representative, non-limiting example of a "circuit board" according to the present teachings), which is housed inside the housing 18 and is mounted on the first inner-side seat surfaces 52*a* and the first outer-side seat surfaces 56*a* (and optionally the second inner-side seat surfaces 54*a* and the second outer-side seat surfaces 58*a*); the first terminal portions 20*b* (and optionally the second terminal portions 22*b*) (representative, non-limiting examples of a "terminal" according to the present teachings) within the housing 18, which are connected to the circuit board 16; and the first waterproof sheet 60 (and optionally the second waterproof sheet 62) (representative, non-limiting example of an "elastic sheet" according to the present teachings), which surrounds the perimeters of the first terminal portions 20*b* (and optionally the second terminal portions 22*b*) and is interposed between the circuit board 16 on one side and the first inner-side seat surfaces 52*a* and the first outer-side seat surfaces 56*a* on the other side (and optionally the second inner-side seat surfaces 54*a* and the second outer-side seat surfaces 58*a* on the other side).

According to the above-mentioned configuration, even if an electrically conductive substance, such as water, has adhered to (contacts) a surface of the circuit board 16 on the side that makes contact with the first inner-side seat surfaces 52*a* and the first outer-side seat surfaces 56*a* (and optionally the second inner-side seat surfaces 54*a* and the second outer-side seat surfaces 58*a*), the connection locations—at which the circuit board 16 and the first terminal portions 20*b* (and optionally the second terminal portions 22*b*) are respectively connected—are sealed by the first waterproof sheet 60 (and optionally the second waterproof sheet 62). Therefore, this configuration prevents the possibility of adverse short circuiting between any of the connection locations at which the circuit board 16 and the first terminal portions 20*b* (and the second terminal portions 22*b*) are respectively connected and another location that should not be electrically connected thereto. In addition, according to the above-mentioned configuration, the first waterproof sheet 60 (and optionally the second waterproof sheet 62) is interposed between the circuit board 16 on one side and the first inner-side seat surfaces 52*a* and the first outer-side seat surfaces 56*a* on the other side (and optionally the second inner-side seat surfaces 54*a* and the second outer-side seat surfaces 58*a* on the other side). Therefore, the adhesion characteristics of the first waterproof sheet 60 (and optionally the second waterproof sheet 62) can be further improved.

In one or more embodiments of the present teachings, the first terminal portions 20*b* (and optionally the second terminal portions 22*b*) are connected (electrically connected) to the battery cells 12.

In such embodiments, in the event that any of the connection locations, at which the circuit board 16 and the first terminal portions 20*b* (and the second terminal portions 22*b*) connected to the battery cells 12 are respectively connected, were to (hypothetically) adversely short circuit (become electrically connected) with another location (i.e. to which the connection location should not be electrically connected), a large electrical current may flow and might damage the battery cells 12 and/or the circuit board 16, Therefore it is necessary to reliably prevent short circuits between the battery cells 12. According to the above-mentioned configuration, it is possible to reliably prevent any of the connection locations, at which the circuit board 16 and the first terminal portions 20*b* (and the second terminal portions 22*b*) connected to the battery cells 12 are respectively connected, from adversely short circuiting with another location, to which the connection locations should not be electrically connected.

In one or more embodiments of the present teachings, the battery pack 10 may optionally further comprise the cell holder 14, which is housed inside the housing 18 and holds the battery cells 12. The first inner-side seat surfaces 52*a* and the first outer-side seat surfaces 56*a* (and optionally the second inner-side seat surfaces 54*a* and the second outer-side seat surfaces 58*a*) may be formed on the cell holder 14.

By using a configuration such that the first inner-side seat surfaces 52*a* and the first outer-side seat surfaces 56*a* (and the second inner-side seat surfaces 54*a* and the second outer-side seat surfaces 58*a*) are formed on the cell holder 14, which holds the battery cells 12, and such that the circuit board 16 is mounted on the first inner-side seat surfaces 52*a* and the first outer-side seat surfaces 56*a* (and the second inner-side seat surfaces 54*a* and the second outer-side seat surfaces 58*a*), the battery pack 10 can be made more compact. According to the above-mentioned configuration, such a battery pack 10 makes it possible to prevent any of the connection locations, at which the circuit board 16 and the first terminal portions 20*b* (and the second terminal portions 22*b*) are respectively connected, from adversely short circuiting with another location, to which the connection locations should not be electrically connected.

In one or more embodiments of the present teachings, the first waterproof sheet 60 (and optionally the second waterproof sheet 62) is bonded (adhered) to the circuit board 16.

According to the above-mentioned configuration, the circuit board 16 is mounted on the first inner-side seat surfaces 52*a* and the first outer-side seat surfaces 56*a* (and optionally the second inner-side seat surfaces 54*a* and the second outer-side seat surfaces 58*a*) with the first waterproof sheet 60 (and optionally the second waterproof sheet 62) bonded to the circuit board 16. Therefore, the first waterproof sheet 60 (and optionally the second waterproof sheet 62) can be interposed between the circuit board 16 on one side and the first inner-side seat surfaces 52*a* and the first outer-side seat surfaces 56*a* on the other side (and optionally the second inner-side seat surfaces 54*a* and the second outer-side seat surfaces 58*a* on the other side). Consequently, the first waterproof sheet 60 (and optionally the second waterproof sheet 62) can be easily aligned with the connection locations, at which the circuit board 16 and the first terminal portions 20*b* (and the second terminal portions 22*b*) are respectively connected.

In one or more embodiments of the present teachings, a plurality of first terminal portions 20b (and optionally second terminal portions 22b) (representative, non-limiting examples of a "first terminal" and a "second terminal" according to the present teaching) may be provided, and each is separately connected to the circuit board 16. The first waterproof sheet 60 (and the second waterproof sheet 62) preferably has a shape such that the perimeters of the plurality of first terminal portions 20b (and second terminal portions 22b) are seamlessly and integrally surrounded (encircled).

According to the above-mentioned configuration, every connection location, at which the circuit board 16 and the plurality of first terminal portions 20b are respectively connected, can be protected by a single waterproof sheet. Similarly, every connection location, at which the circuit board 16 and the plurality of second terminal portions 20b are respectively connected, can be protected by a single waterproof sheet. Accordingly, the part count of the battery pack 10 can be reduced.

In one or more embodiments of the present teachings, the first notches 42 (and optionally second notches 44) (representative, non-limiting examples of a "notch" according to the present teachings) may be defined along an edge (or edges) of the circuit board 16 between the connection locations, at which the circuit board 16 and the plurality of first terminal portions 20b (and optionally second terminal portions 22b) are respectively connected.

According to the above-mentioned configuration, it is possible to more reliably prevent the occurrence of adverse short circuiting between the connection locations, at which the circuit board 16 and the plurality of first terminal portions 20b (and optionally second terminal portions 22b) are connected.

In one or more embodiments of the present teachings, the battery pack 10 may further comprise the coatings 50 disposed on the surface of the circuit board 16 on the side opposite the surface on which the first waterproof sheet 60 (and optionally the second waterproof sheet 62) is provided. These coatings 50 may cover (seal) the connection locations at which the circuit board 16 and the first terminal portions 20b (and optionally the second terminal portions 22b) are respectively connected.

In the above-mentioned configuration, on one surface of the circuit board 16, the connection locations—at which the circuit board 16 and the first terminal portions 20b (and the second terminal portions 22b) are respectively connected— are protected by the first waterproof sheet 60 (and the second waterproof sheet 62). On the other surface of the circuit board 16, the connection locations—at which the circuit board 16 and the first terminal portions 20b (and the second terminal portions 22b) are respectively connected—are protected by the coatings 50. Accordingly, it is possible to more reliably prevent the occurrence of short circuiting between any of the connection locations, at which the circuit board 16 and the first terminal portions 20b (and optionally the second terminal portions 22b) are connected, and another location that should not be electrically connected thereto.

In one or more embodiments of the present teachings, the first waterproof sheet 60 (and the second waterproof sheet 62) may be composed of at least one elastic (compressible) material selected from the group consisting of rubber, elastomer, resin foam, and sponge.

According to the above-mentioned configuration, the first waterproof sheet 60 (and the second waterproof sheet 62) can be prepared from a material that is easy to obtain and easy to mold, and consequently the manufacturing cost of the battery pack 10 can be reduced.

EXPLANATION OF THE REFERENCE NUMBERS

10 Battery pack
12 Battery cell
12a First end
12b Second end
14 Cell holder
16 Circuit board
16a First side edge
16b Second side edge
16c First through hole
16d Second through hole
18 Housing
18a Engaging structure
18b Opening
20 First lead plate
20a First main portion
20b First terminal portion
20c First extension portion
22 Second lead plate
22a Second main portion
22b Second terminal portion
22c Second extension portion
24 External-connection terminal
26 First holder main body
28 Second holder main body
30 First holder cover
32 Second holder cover
34 First outer-side waterproof sheet
36 First inner-side waterproof sheet
38 Second outer-side waterproof sheet
40 Second inner-side waterproof sheet
42 First notch
44 Second notch
50 Coating
52 First support piece
52a First inner-side seat surface
54 Second support piece
54a Second inner-side seat surface
56 First support platform
56a First outer-side seat surface
58 Second support platform
58a Second outer-side seat surface
60 First waterproof sheet
62 Second waterproof sheet

The invention claimed is:
1. A battery pack comprising:
a housing;
at least one battery cell disposed within the housing;
at least one seat surface disposed inside the housing;
a circuit board disposed within the housing and being mounted on the at least one seat surface;
at least one lead plate having a terminal portion electrically connected to the circuit board; and
at least one elastic sheet interposed between the circuit board and the at least one seat surface, the at least one elastic sheet surrounding an entire perimeter of the terminal portion in a direction perpendicular to an extension direction of the terminal portion;
wherein:
the circuit board includes a plurality of connection locations;

the at least one lead plate comprises a first lead plate having a first terminal portion and a second first lead plate having a first terminal portion;

the first terminal portion of the first lead plate is connected to the circuit board at a first one of the plurality of connection locations and the first terminal portion of the second first lead plate is connected to the circuit board at a second one of the plurality of connection locations;

the circuit board has a peripheral edge having a portion perpendicular to a longitudinal direction of at least one of the battery cells;

a plurality of notches extend into the portion of the peripheral edge;

each adjacent pair of the plurality of notches defines a tongue therebetween; and one of the plurality of connection locations is located on each of the tongues.

2. The battery pack according to claim 1, wherein the at least one lead plate is electrically connected to the at least one battery cell.

3. The battery pack according to claim 1, further comprising:
a cell holder disposed within the housing and holding the at least one battery cell;
wherein the at least one seat surface is defined on the cell holder.

4. The battery pack according to claim 1, wherein the at least one elastic sheet is adhered to the circuit board.

5. The battery pack according to claim 1, wherein
the at least one elastic sheet is a single elastic sheet that seamlessly and integrally surrounds an entire perimeter of the first terminal portion of the first lead plate and an entire perimeter of the first terminal portion of the second first lead plate.

6. The battery pack according to claim 1, wherein:
the at least one elastic sheet is disposed on a first surface of the circuit board,
at least one coating is disposed on a second surface of the circuit board that is opposite of the first surface of the circuit board, and
the at least one coating covers and seals a connection location at which the terminal portion is electrically connected to the circuit board.

7. The battery pack according to claim 5, wherein the at least one coating comprises a polyurethane or an epoxy.

8. The battery pack according to claim 1, wherein the at least one elastic sheet is composed of at least one material selected from the group consisting of rubber, elastomer, resin foam, and sponge.

9. The battery pack according to claim 1, wherein the at least one elastic sheet exhibits a compressibility in a thickness direction of the elastic sheet of at least 3%.

10. The battery pack according to claim 9, wherein the at least one elastic sheet exhibits a recovery after compression in the thickness direction of the elastic sheet of at least 40%.

11. The battery pack according to claim 1, wherein the at least one elastic sheet has a thickness of 0.3-4 mm.

12. The battery pack according to claim 1, wherein:
the at least one elastic sheet comprises a first elastic sheet and a second elastic sheet that is discrete from the first elastic sheet,
the at least one lead plate further comprises a first second lead plate having a second terminal portion and a second lead plate having a second terminal portion, the first elastic sheet has a plurality of first through holes through which the first terminal portions respectively pass, and the second elastic sheet has a plurality of second through holes through which the second terminal portions respectively pass.

13. The battery pack according to claim 12, wherein:
the at least one battery cell comprises a plurality of battery cells disposed in parallel to each other,
the first terminal portions are each respectively electrically connected to first longitudinal ends of the battery cells via a first main portion and a first bent extension portion of the first lead plates;
the second terminal portions are respectively electrically connected to second longitudinal ends of the battery cells via a second main portion and a second bent extension portion of the second lead plates.

14. The battery pack according to claim 13, further comprising:
a first waterproof sheet covering the first main portions, and
a second waterproof sheet covering the second main portions.

15. A battery pack comprising:
a housing;
at least one battery cell disposed within the housing;
at least one seat surface disposed inside the housing;
a circuit board disposed within the housing and being mounted on the at least one seat surface;
at least one lead plate having a terminal portion electrically connected to the circuit board; and
at least one elastic sheet interposed between the circuit board and the at least one seat surface, the at least one elastic sheet surrounding an entire perimeter of the terminal portion in a direction perpendicular to an extension direction of the terminal portion;
wherein:
the at least one elastic sheet comprises a first elastic sheet and a second elastic sheet that is discrete from the first elastic sheet;
the at least one lead plate comprises a plurality of first lead plates each having a first terminal portion and a plurality of second lead plates each having a second terminal portion;
the first elastic sheet has a plurality of first through holes through which the first terminal portions respectively pass;
the second elastic sheet has a plurality of second through holes through which the second terminal portions respectively pass;
the at least one battery cell comprises a plurality of battery cells disposed in parallel to each other;
the first terminal portions are each respectively electrically connected to first longitudinal ends of the battery cells via a first main portion and a first bent extension portion of the first lead plates;
the second terminal portions are respectively electrically connected to second longitudinal ends of the battery cells via a second main portion and a second bent extension portion of the second lead plates;
a first waterproof sheet covers the first main portions;
a second waterproof sheet covers the second main portions;
a cell holder is disposed within the housing and holds the plurality of battery cells;
the at least one seat surface comprises a plurality of seat surfaces that are all defined on the cell holder;

the first and second elastic sheets are gaskets that are adhered to a first surface of the circuit board;

a first plurality of notches is defined along a first edge of the circuit board, a second plurality of notches is defined along a second edge of the circuit board that is opposite of the first edge of the circuit board, the first notches are respectively defined between a plurality of first connection locations at which the first terminal portions are respectively electrically connected to the circuit board such that a first line intersecting the plurality of first connection locations is intersected by the first notches; and the second notches are respectively defined between a plurality of second connection locations at which the second terminal portions are respectively electrically connected to the circuit board such that a second line intersecting the plurality of second connection locations is intersected by the second notches.

16. The battery pack according to claim 15, further comprising:

a plurality of discrete coatings disposed on a second surface of the circuit board that is opposite of the first surface of the circuit board, wherein the discrete coatings respectively cover and seal the first and second connection locations on the second surface of the circuit board.

17. The battery pack according to claim 16, wherein the discrete coatings each comprise a polyurethane or an epoxy.

18. The battery pack according to claim 16, wherein the first and second elastic sheets each:

are composed of at least one material selected from the group consisting of rubber, elastomer, resin foam, and sponge;

exhibit a compressibility in a thickness direction of the elastic sheet of at least 3%;

exhibit a recovery after compression in the thickness direction of the elastic sheet of at least 40%; and have a thickness of 0.3-4 mm.

* * * * *

UNITED STATES PATENT AND TRADEMARK OFFICE
CERTIFICATE OF CORRECTION

PATENT NO. : 11,677,116 B2
APPLICATION NO. : 16/824232
DATED : June 13, 2023
INVENTOR(S) : Nagahama et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 539 days.

Signed and Sealed this
Thirty-first Day of December, 2024

Derrick Brent
*Acting Director of the United States Patent and Trademark Office*